(12) United States Patent
You

(10) Patent No.: US 7,759,051 B2
(45) Date of Patent: Jul. 20, 2010

(54) LASER MASK AND METHOD OF CRYSTALLIZATION USING THE SAME

(75) Inventor: JaeSung You, Yeongdeungpo-Gu (KR)

(73) Assignee: LG Display Co., Ltd., Seoul (KR)

( * ) Notice: Subject to any disclaimer, the term of this patent is extended or adjusted under 35 U.S.C. 154(b) by 413 days.

(21) Appl. No.: 11/878,591

(22) Filed: Jul. 25, 2007

(65) Prior Publication Data

US 2008/0029769 A1 Feb. 7, 2008

Related U.S. Application Data

(62) Division of application No. 11/010,670, filed on Dec. 14, 2004, now Pat. No. 7,276,317.

(30) Foreign Application Priority Data

Dec. 29, 2003 (KR) .................. 10-2003-0099371

(51) Int. Cl.
*G02B 5/20* (2006.01)
*H01L 29/04* (2006.01)
(52) U.S. Cl. ........................ 430/321; 257/72
(58) Field of Classification Search .............. 430/5, 430/394, 321; 438/150, 166; 257/72
See application file for complete search history.

(56) References Cited

U.S. PATENT DOCUMENTS 6,523,163 B1   2/2003   Toyama

2001/0046755 A1*  11/2001  Hara et al. ............ 438/488
2004/0083445 A1    4/2004  Mukai et al.
2006/0024858 A1    2/2006  Kumomi et al.

FOREIGN PATENT DOCUMENTS

| CN | 1630027 A | 6/2005 |
|----|-----------|--------|
| JP | 2002151408 | 5/2002 |
| JP | 2003-045803 | 2/2003 |
| JP | 2003-109903 | 4/2003 |
| JP | 2003-309080 | 10/2008 |

* cited by examiner

*Primary Examiner*—Stephen Rosasco
(74) *Attorney, Agent, or Firm*—McKenna Long & Aldridge LLP

(57) ABSTRACT

A laser mask and method of crystallization using the same that can produce a polycrystalline silicon thin film having uniform crystallization characteristics. According to the present invention, a method of crystallization using a laser mask having a reference pattern in a first block and the reverse pattern of the reference pattern in a second block includes providing a substrate having a silicon thin film; positioning the first block of the laser mask over a portion of the silicon film and irradiating a first laser beam through the first block; and moving either the laser mask or the substrate to position the second block of the laser mask over the portion of the silicon film and irradiating a second laser beam through the second block.

7 Claims, 15 Drawing Sheets

473A 474A
475A 474B 473B
475B

LASER MASK AND METHOD OF CRYSTALLIZATION USING THE SAME

This is a divisional application of application No. 11/010,670 filed on Dec. 14, 2004, now U.S. Pat. No. 7,276,317 which claims the benefit of Korean Patent Application No. 10-2003-0099371 filed Dec. 29, 2003, which is hereby incorporated by reference for all purposes as if fully set forth herein.

BACKGROUND OF THE INVENTION

1. Field of the Invention

The present invention relates to a laser mask and a method of crystallization using the same, and more particularly to, a laser mask and a method of crystallization using the same that can produce a polycrystalline silicon thin film having uniform crystallization characteristics.

2. Discussion of the Related Art

Recently, due to the needs for information displays, especially for portable information displays, thin film type flat panel display (FPD) devices have been actively being researched and commercialized such that the cathode ray tubes (CRT) are being replaced. Of these flat panel display devices, liquid crystal display (LCD) devices are widely used for notebook computers and desktop monitors, due to their excellent resolution, color rendering capability and picture quality.

An active matrix (AM) driving method, a typical driving method used for the LCD devices, drives each of the pixels of an LCD device using an amorphous silicon thin film transistor (a-Si TFT) as a switching element. The a-Si TFT technique was described by English LeComber et al. in 1979, and was commercialized as a three-inch liquid crystal portable television in 1986. Recently, a TFT-LCD device with a display area of more than 50 inches has been developed. However, the field effect mobility of the a-Si TFT is about 1 $cm^2/Vsec$, which prevents its use in peripheral circuits that apply signals to the pixels, because the peripheral circuits generally operate at more than 1 MHz. Accordingly, researches for simultaneously forming switching transistors in a pixel region and peripheral circuits in a driving circuit region on a glass substrate using a polycrystalline silicon (poly-Si) TFT having a field effect mobility greater than that of the a-Si TFT have been actively pursued.

The poly-Si TFT has been applied to small flat panel displays, such as the eyepiece of camcorders, since an LCD color television was developed in 1982. Such a TFT has low photosensitivity and high field effect mobility, and it can be directly fabricated on a substrate to form driving circuits. Increased mobility can increase the operation frequency of the driving circuits. The frequency capability of the driving circuits determines the number of the pixels that can be driven while maintaining adequate display capability. More specifically, the increased frequency decreases the charging time of a signal applied to a pixel such that distortion of the signal is decreased and the picture quality increases.

The poly-Si TFT can be fabricated by directly depositing a polycrystalline silicon thin film on a substrate or by depositing an amorphous silicon thin film that is then crystallized by a thermal process. To use a cheap glass as a substrate, low temperature processes are required, and, to use the poly-Si TFT for driving circuits, a method for increasing the field effect mobility is required. In general, thermal processing methods for crystallizing an amorphous silicon thin film are the solid phase crystallization (SPC) method and the excimer laser annealing (ELA) method.

The SPC method forms a polycrystalline silicon thin film at a low temperature of approximately 600° C. In this method, a polycrystalline silicon thin film is formed by depositing an amorphous silicon thin film on a glass substrate having a low melting point and then by performing a slow heating process at approximately 600° C. for up to tens of hours. A polycrystalline silicon thin film obtained by the SPC method has comparatively large-size grains of about several μm (micrometers). However, there are many defects in the grains. Although not as bad as grain boundaries in a poly-Si TFT, these defects affect negatively on the performance of a poly-Si TFT.

The excimer laser annealing method is a typical method of fabricating a poly-Si TFT at a low temperature. The excimer laser crystallizes an amorphous silicon thin film by irradiating a high energy laser beam onto the amorphous silicon thin film for a time of ten nanoseconds. In this method, the amorphous silicon is melted and crystallized in a very short time, so that the glass substrate is not damaged. A polycrystalline silicon thin film fabricated by the excimer laser method also has excellent electrical characteristics, compared to a poly-Si thin film fabricated by a general thermal processing method. For example, a field effect mobility of a poly-Si TFT fabricated by the excimer laser method is more than 100 $cm^2/Vsec$, whereas a field effect mobility of an a-Si TFT is 0.1~0.2 $cm^2/Vsec$ and a field effect mobility of a poly-Si TFT fabricated by a general thermal processing method is 10~20 $cm^2/Vsec$ (IEEE Trans. Electron Devices, vol. 36, no. 12, p. 2868, 1989).

A crystallization method using a laser will now be described in detail. FIG. 1 is a graph illustrating a relationship between a grain size of a polycrystalline silicon thin film and an energy density of a laser used to form the polycrystalline silicon thin film.

As shown in FIG. 1, in the first and second regions I and II, as the energy density increases, the grain size of the polycrystalline silicon thin film increases, as discussed in IEEE Electron Device Letters, DEL-7, 276, 1986. However, in the third region III, when the energy density becomes higher than a specific energy density Ec, the grain size of the crystallized polycrystalline silicon thin film decreases drastically. That is, according to the graph shown in FIG. 1, the crystallization mechanism for the silicon thin film becomes different when the energy density is higher than a specific energy density Ec.

FIGS. 2A to 2C, 3A to 3C and 4A to 4C are sectional views illustrating silicon crystallization mechanisms according to the laser energy densities of FIG. 1. That is, they illustrate sequential crystallization process according to each laser energy density. A crystallization mechanism of amorphous silicon by a laser annealing is influenced by many factors, such as laser irradiation conditions including laser energy density, irradiation pressure, substrate temperature, and physical/geometrical characteristics including absorption coefficient, thermal conductivity, mass, impurity containing degree and amorphous silicon layer thickness.

First, as shown in FIGS. 2A to 2C, the first region (I) of FIG. 1 is a partial melting region, and an amorphous silicon thin film 12 is crystallized only down to the dotted line and a size of a grain G1 formed at this time is about hundreds Å. When a laser beam is irradiated on the amorphous silicon thin film 12 on a substrate 10 where a buffer layer 11 is formed, the amorphous silicon thin film 12 is melted. At this time, because strong laser energy is irradiated directly at a surface of the amorphous silicon thin film 12 and relatively weak laser energy is irradiated at a lower portion of the amorphous silicon thin film 12, the amorphous silicon thin film 12 is melted only down to a certain portion, thereby achieving a partial crystallization.

Typically, in the laser crystallization method, crystals grow through the processes of primary melting in which a surface layer of an amorphous silicon thin film is melted by a laser irradiation, secondary melting in which a lower portion of the amorphous silicon thin film is melted by the latent heat generated during the solidification of the melted silicon, and the solidification of the lower layer. These crystal growth processes will be explained in more detail.

An amorphous silicon thin film on which a laser beam is irradiated has a melting temperature of more than 1000° C. and primarily melts into a liquid state. Because there is a great temperature difference between the surface melted layer and the lower silicon and substrate, the surface melted layer cools fast until solid phase nucleation and solidification are achieved. The surface layer remains melted until the solid phase nucleation and solidification are completed. The melting state lasts for a long time when the laser energy density is high or thermal emission to the outside is low. Because the surface layer melts at a lower temperature, for example 1000° C., than the melting temperature of 1400° C. for crystalline silicon, the surface layer cools and maintains a super-cooled state where the temperature is lower than the phase transition temperature.

The greater the super-cooling state is, that is, the lower the melting temperature of the thin film or the faster the cooling speed is, the greater the nucleation rate is at the time of the solidification such that fine crystals grow during the solidification. When the solidification starts as the melted surface layer cools, crystals grow in an upward direction from a crystal nucleus. At this time, latent heat is generated during the phase transition of the melted surface layer from liquid state to solid state, and thus the secondarily melting begins where the lower amorphous silicon thin film melts. Then, the solidification of the lower amorphous silicon thin film occurs. At this time, the nucleus generation rate of the lower second melted layer increases, because the lower amorphous silicon thin film is more super-cooled than the first melted layer. Thus, the crystal size resulting from the second melted layer is smaller. Accordingly, the cooling speed of the solidification has to be reduced to improve the crystalline characteristics. Cooling speed can be reduced by restraining absorbed laser energy from being emitted to the outside. Examples of the restraining method are heating the substrate, double beam irradiation, or inserting a buffer insulating layer between the substrate and the amorphous silicon layer.

FIGS. 3A to 3C are sectional views illustrating the silicon crystallization mechanism of the second region (II) of FIG. 1, in which the second region (II) represents a near-completely crystallized region.

Referring to FIGS. 3A to 3C, a polycrystalline silicon thin film has relatively large grains 30A-30C of about 3000 to 4000 Å formed down to the interface of the lower buffer layer 11. When a nearly complete melting energy, not a complete melting energy, is irradiated on the amorphous silicon thin film 12, almost all of the amorphous silicon thin film 12 close to the buffer layer 11 melts. At this time, solid seeds 35 that have not been melted at the interface between the melted silicon thin film 12' and the buffer layer 11 work as a crystallization nucleus to induce a lateral growth, thereby forming the relatively large grains 30A-30C (J. Appl. Phys. 82, 4086). However, because this crystallization only occurs when the laser energy is such that the solid seeds 35 remain on the interface with the buffer layer 11, the process margin is very limited. In addition, because the solid seeds 35 are generated non-uniformly, the crystallized grains 30A-30C of the polycrystalline silicon thin film have different crystallization directions, thereby resulting in non-uniform crystallization characteristics.

FIGS. 4A to 4C are sectional views illustrating the silicon crystallization mechanism of the third region (III) of FIG. 1 corresponding to a completely crystallized region.

Referring to FIGS. 4A to 4C, very small grains 30 are irregularly formed with a energy density corresponding to the third region (III). When the laser energy density becomes higher than a specific energy density Ec, sufficient energy is applied enough to completely melt the amorphous silicon thin film 12, leaving no solid seed that may be grown to grains. Thereafter, the silicon thin film 12' which has been melted upon receiving the laser beam of the strong energy undergoes a rapid cooling process, which generates a plurality of uniform nuclei 35 and thus fine grains 30.

Meanwhile, an excimer laser annealing method employing a pulse-type laser is typically used for the laser crystallization, and a sequential lateral solidification (SLS) method, which shows remarkable improvement of crystallization characteristics by growing grains in a horizontal direction, has recently been proposed and studied widely.

The sequential lateral solidification (SLS) utilizes the fact that grains grow laterally from an interface between liquid phase silicon and solid phase silicon (Robert S. Sposilli, M. A. Crowder, and James S. Im, Mat. Res. Soc. Symp. Proco. Vol. 452, 956 to 957, 1997). In this method, grains grow laterally with a predetermined length by controlling the laser energy density and irradiation range of a laser beam, thereby increasing the size of silicon grains.

This SLS is one example of lateral solidification (LS), and the crystallization mechanism with respect to the LS will now be described with reference to the accompanying drawings. FIGS. 5A to 5C are sectional views sequentially illustrating a crystallization process according to a related art general lateral crystallization.

Referring to FIG. 5A, when a laser having an energy density in the third region (III) of FIG. 1, the energy density capable of completely melting an amorphous silicon thin film 112, is irradiated onto a portion of an amorphous silicon thin film 112, the portion of the amorphous silicon film completely melts. A patterned mask can be employed to form a laser irradiated region and a laser non-irradiated region. At this time, as shown in FIGS. 5B and 5C, because the laser has sufficient energy, the amorphous silicon thin film 112 irradiated by the laser can be completely melted. However, the laser beam is irradiated with certain intervals on the amorphous silicon thin film 112, crystals grow from the interface between the silicon thin film 112 of the laser non-irradiated region (solid phase) and the melted silicon thin film 112' (liquid phase).

Thus, the interface provides nuclei for this crystallization. In other words, immediately after the laser beam is irradiated, the melted silicon thin film 112' cools from the left/right surfaces, the interfaces of the laser non-irradiated region. This is because the solid phase amorphous silicon thin film 112 has higher heat conductivity than the buffer layer 111 or the glass substrate 110 below the silicon thin films 112 and 112'. Accordingly, the melted silicon thin film 112' first reaches a nucleus formation temperature at the interface between the horizontal solid phase and the liquid phase, rather than at the central portion, thereby forming a crystal nucleus at the corresponding portion. After the crystal nucleus is formed, grains 130A and 130B horizontally grow from a low-temperature side to a high-temperature side, that is, from the interface to the central portion. Due to the lateral crystallization, large-size grains 130A and 130B can be formed, and because the process is performed with the energy density of the third region, the process margin is not limited, compared to other regions.

However, the SLS has the following problems. That is, the crystallization is performed by infinitesimally and repeatedly moving the mask or the stage in order to increase the size of the grains. As a result, the process time for crystallizing a large-size amorphous silicon thin film is lengthened and the process yield becomes low.

SUMMARY OF THE INVENTION

Accordingly, the present invention is directed to a laser mask and a method of crystallization using the same that substantially obviates one or more of the problems due to limitations and disadvantages of the related art.

An advantage of the present invention is to provide a laser mask and a method of crystallization using the same that can produce a polycrystalline silicon thin film having uniform crystallization characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a laser mask having first and second blocks includes a reference pattern in the first block; and the reverse pattern of the reference pattern in the second block.

In another aspect of the present invention, a method of crystallization using a laser mask having a reference pattern in a first block and the reverse pattern of the reference pattern in a second block, includes providing a substrate having a silicon thin film; positioning the first block of the laser mask over a portion of the silicon film and irradiating a first laser beam through the first block; and moving either the laser mask or the substrate to position the second block of the laser mask over the portion of the silicon film and irradiating a second laser beam through the second block.

In another aspect of the present invention, a method for fabricating a flat panel display device having a thin film transistor as a switching device includes providing a substrate having a silicon thin film; and crystallizing the silicon film into a polycrystalline silicon thin film to form an active layer of the thin film transistor using a laser mask, the laser mask has a reference pattern in a first block and the reverse pattern of the reference pattern in a second block.

In still another aspect of the present invention, a flat panel display device having a thin film transistor as a switching device includes an active layer of the thin film transistor, which includes a polycrystalline silicon thin film having a polygon shape grain boundary.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

Figure 1:
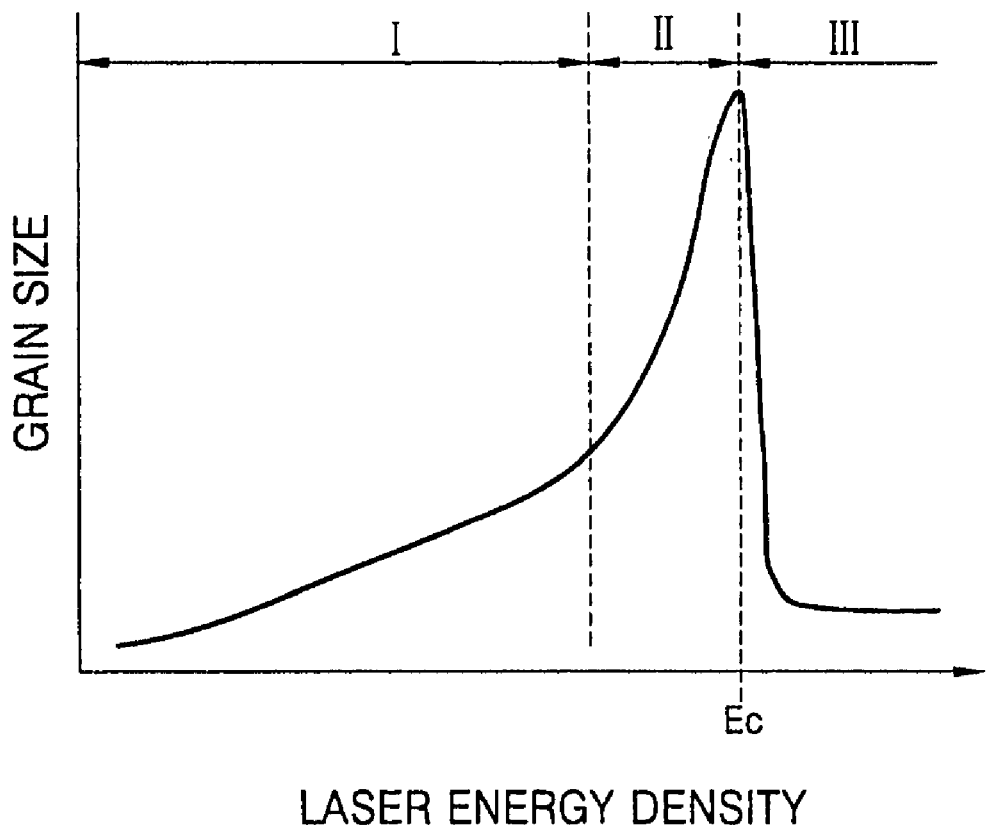
FIG. 1 is a graph illustrating a relationship between a grain size of a polycrystalline silicon thin film and an energy density of a laser used to form the polycrystalline silicon thin film.
Figure 2A:
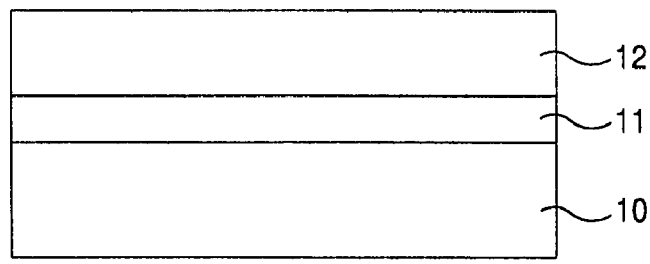
FIGS. 2A to 2C, 3A to 3C, and 4A to 4C are sectional views illustrating silicon crystallization mechanisms according to the laser energy densities of FIG. 1.
Figure 2B:
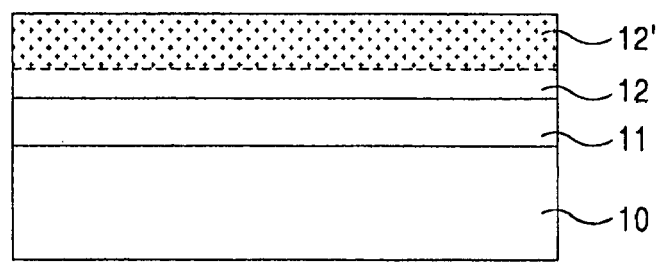
Figure 2C:
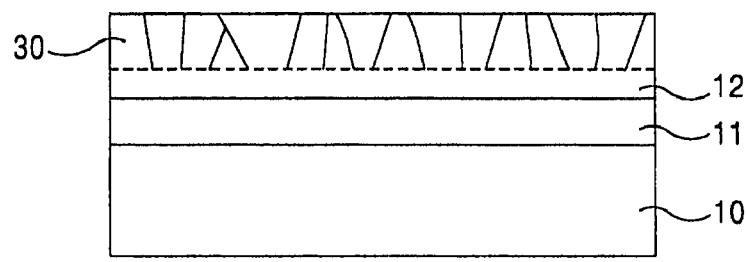
Figure 3A:
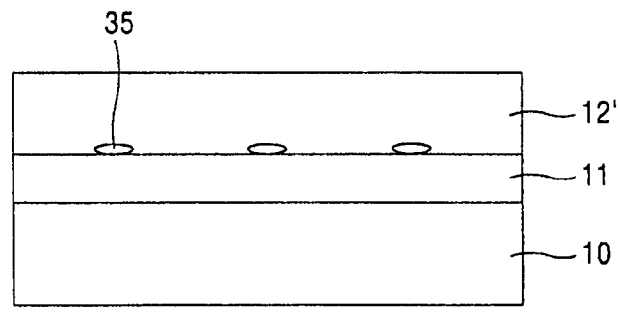
Figure 3B:
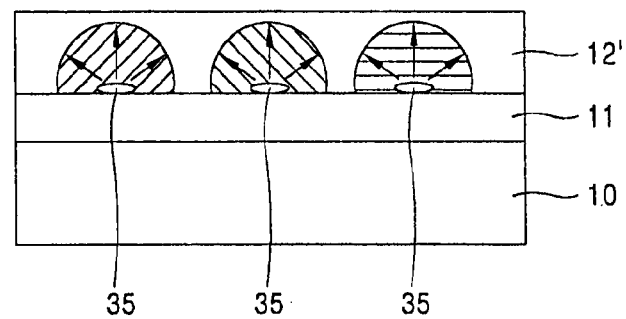
Figure 3C:
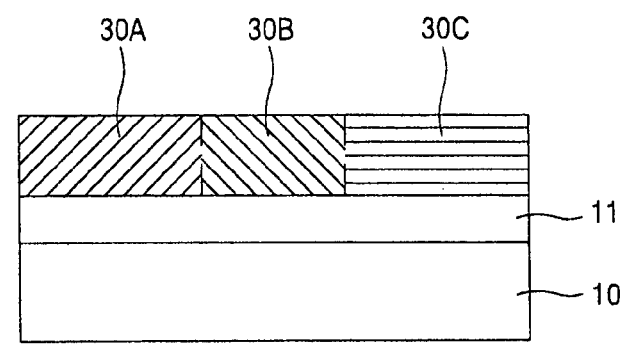
Figure 4A:
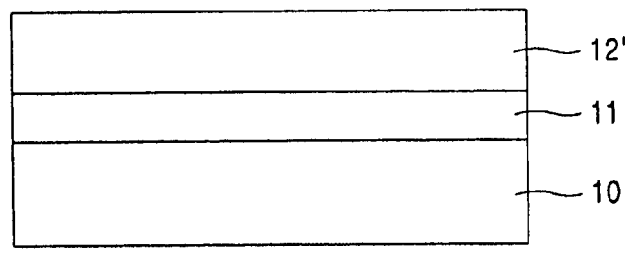
Figure 4B:
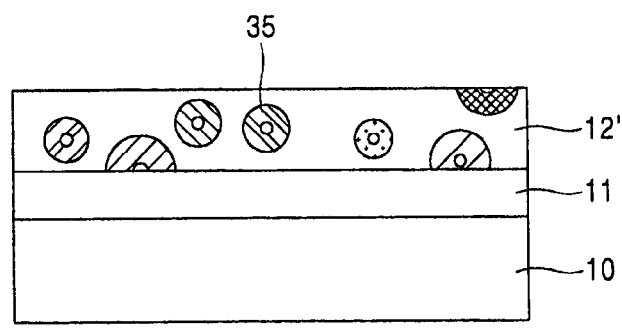
Figure 4C:
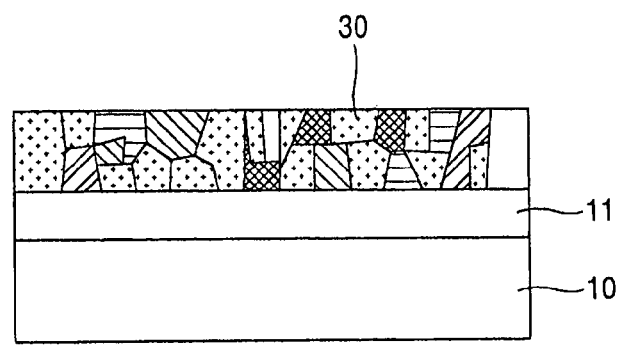
Figure 5A:
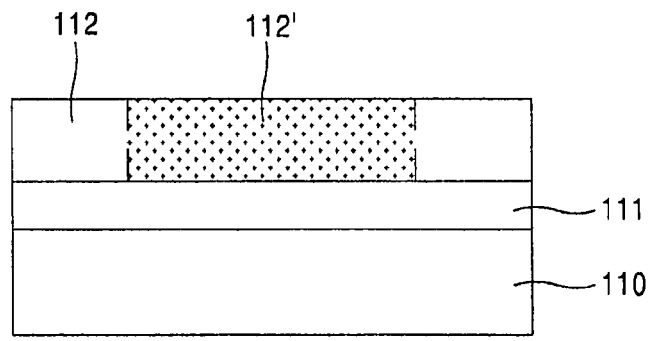
FIGS. 5A to 5C are sectional views sequentially illustrating a crystallization process according to a related art lateral crystallization.
Figure 5B:
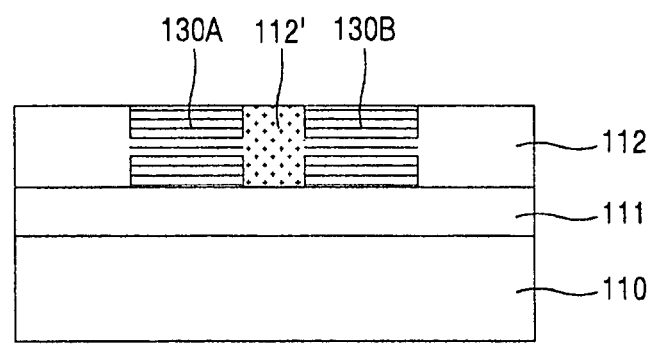
Figure 5C:
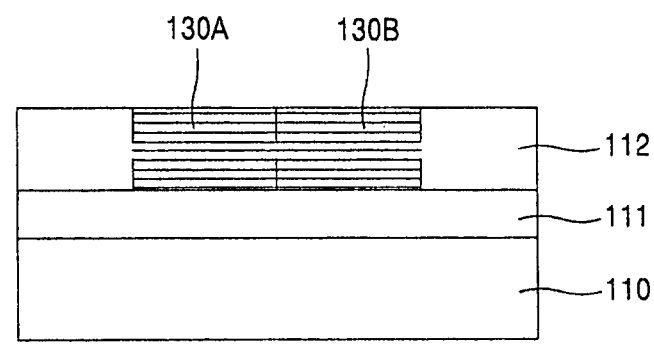
Figure 6A:
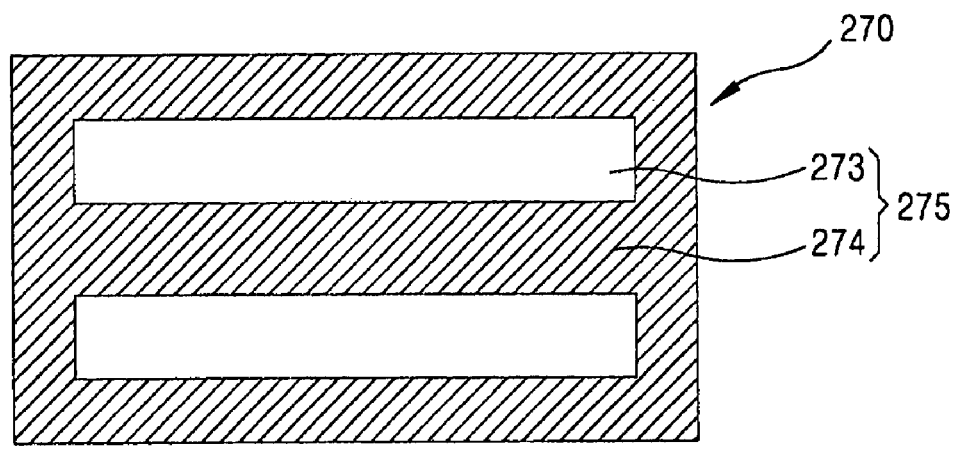
FIG. 6A is a plan view illustrating an example of a laser mask used for a sequential lateral solidification (SLS)

FIG. 6A is a plan view illustrating an example of a laser mask used for a sequential lateral solidification (SLS), which is designed to shorten crystallization time compared to the related art. Referring to FIG. 6A, a laser mask 270 includes a slit type pattern 275 having a rectangular transmitting region 273 with a predetermined width and length. The laser mask 270 includes two rectangular transmitting regions 273 for transmitting light and blocking region 274 for blocking light. A laser beam transmitted through the transmitting regions 273 of the slit 275 crystallizes a silicon thin film according to the shape (e.g., rectangular shape) of the transmitting regions 273.

Figure 6B:
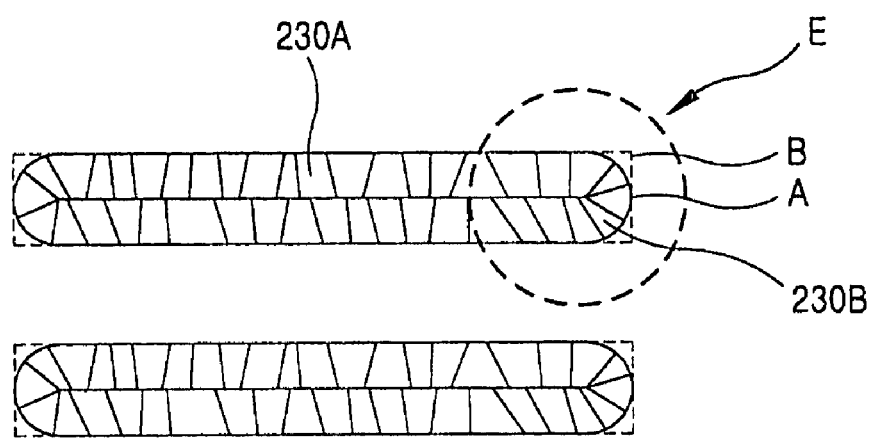
FIG. 6B is a plan view illustrating a silicon thin film crystallized by the mask of FIG. 6A.

Referring to FIG. 6B, however, an edge portion (E) of the crystallized silicon thin film has a round shape different from the mask pattern (the slit 275), due to the diffraction of the laser beam. This will now be described in detail. For reference, the dotted line at the edge portion (E) of the crystallized silicon thin film shown in FIG. 6B illustrates the shape of the slit 275 of the mask 270 used for the crystallization.

Figure 7:
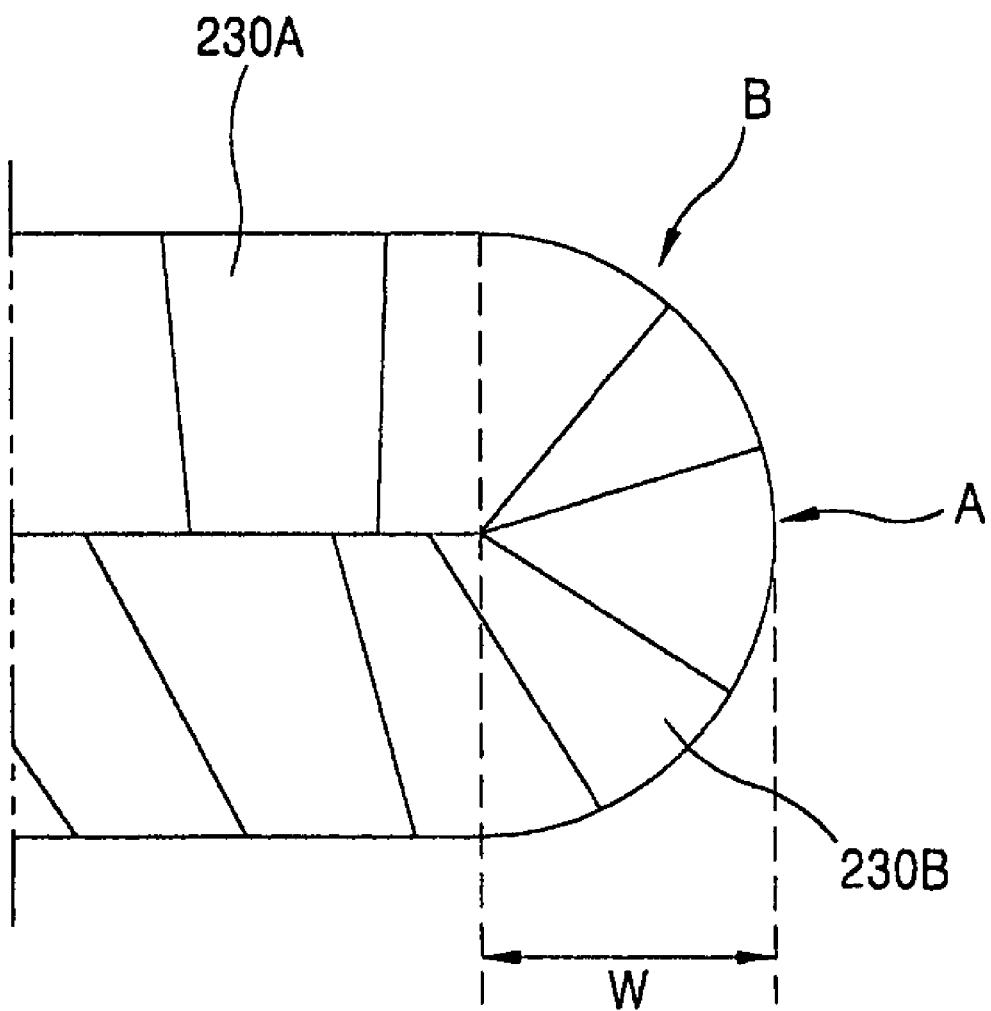
FIG. 7 is an enlarged plan view illustrating the portion 'E' of the crystallized silicon thin film of FIG. 6B.

FIG. 7 is an enlarged plan view illustrating the portion 'E' of the crystallized silicon thin film of FIG. 6B. As shown in FIG. 7, a region 'A', the center of the edge portion (E) has a similar crystallization pattern to the slit 275, because the laser beam having an energy density sufficient to completely melt the silicon film is irradiated. However, the laser beam is diffracted at a region 'B', corners of the edge portion (E) of the slit 275. Thus, the laser beam cannot have an energy density sufficient to completely melt the silicon thin film. As a result, the edge portion (E) becomes to have a convex or round shape. In other words, because the grains in the edge portion (E) of the crystallized silicon thin film having the round shape is grown from nuclei formed near the amorphous silicon thin film (solid phase) at the interface of the melted amorphous silicon, a second grain 230B grows in a direction different from a first grain 230A. That is, the second grain 230B has different crystallization characteristics from the first grain 230A, and as a result, a discontinuous region exists in the crystallized silicon thin film. At this time, because the discontinuous region having a width (W), the convex edge portion (E) of the crystallized silicon thin film, has different crystallization characteristics, it is important to reduce the width (W) of the discontinuous region in order to apply the silicon thin film to an LCD device.

Figure 8A:
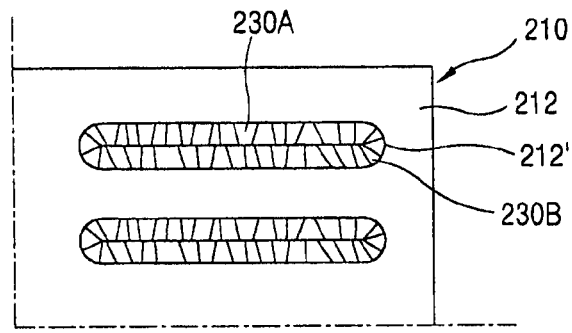
FIGS. 8A to 8C are plan views sequentially illustrating a crystallization process for a silicon thin film using the mask of FIG. 6A.
Figure 8B:
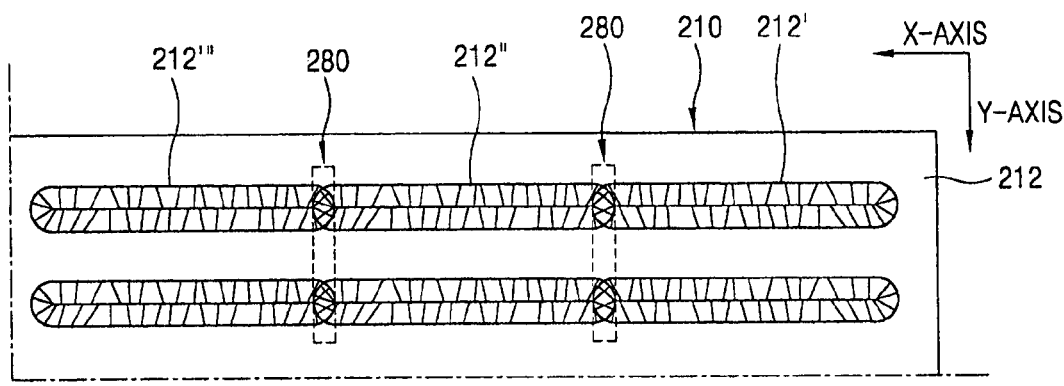
Figure 8C:
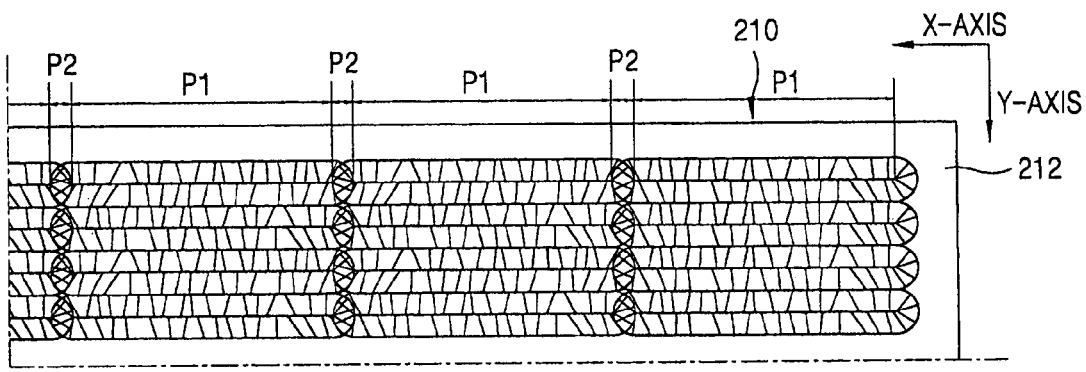

A crystallization process for crystallizing a silicon thin film using the above-described mask will now be described. FIGS. 8A to 8C are plan views sequentially illustrating a crystallization process for a silicon thin film using the mask of FIG. 6A.

First, as shown in FIG. 8A, the mask 270 of FIG. 6A is positioned on or over a substrate 210 to which a laser beam is irradiated to crystallize an amorphous silicon thin film 212 formed on the substrate 210. At this time, the region to be crystallized corresponds to the transmitting region 273 of the mask 270, and when the mask 270 has two transmitting regions, the crystallized region has two crystallization regions having a predetermined length in a horizontal direction. In other words, when the first laser beam is irradiated on the surface of the substrate 210 using the mask 270 including the rectangular slit 275, the silicon thin film, to which the first laser beam has been irradiated through the slit 275, develops a first grain 230A grown laterally (vertically in FIG. 8A) from nuclei formed near the amorphous silicon thin film 212 (solid phase) positioned at the upper and lower boundary surfaces. At this time, as mentioned above, the edge portions of the crystallized silicon thin film 212' have a round shape different from the mask pattern, the shape of the slit 275, due to the diffraction of the laser beam. At the rounded edge portions (E), a second grain 230B grows from nuclei formed near the amorphous silicon thin film 212 (solid phase) positioned at the boundary surface of the melted amorphous silicon in a direction different from the first grain 230A. That is, the second grain 230B has crystallization characteristics different from the first grain 230A, and a discontinuous region exists in the crystallized silicon thin film.

After the first crystallization is completed, the stage (not shown) holding the substrate 210 or the mask 270 placed over the substrate 210 is moved by a short distance not greater than the horizontal length of the pattern of the mask 270 (the width of the slit 275), and then a laser beam is irradiated to proceed with the crystallization process in the direction of 'X' axis. For example, after the stage is moved in the direction of '−X' axis to overlap the discontinuous region 280 of the slit pattern-crystallized silicon thin film 212', a laser beam is then irradiated on the surface of the substrate 210.

Then, as shown in FIG. 8B, the second crystallized pattern 212" having the same pattern as the silicon thin film 212' crystallized by the first crystallization is formed in the direction of 'X' axis, while overlapping the discontinuous region 280 of the first crystallized silicon thin film 212'. Thereafter, when another laser beam is irradiated on the surface of the substrate 210 in the same manner as described with respect to the first laser beam, the third crystallization pattern 212'" having the same pattern as the silicon thin film 212" crystallized by the second crystallization is formed, while overlapping the discontinuous region 280 of the second crystallized silicon thin film 212". At this time, the wider the discontinuous region 280, the wider the overlap region of the laser beam for the next laser beam shot, which increases the overall process time. The discontinuous regions 280 of the crystallized silicon thin films 212', 212" and 212'" have different crystallization characteristics from the crystallized silicon films 212', 212" and 212'". In this respect, because the silicon thin film 212 around the discontinuous regions 280 remains in an amorphous state, without having being crystallized, the next shot of the laser beam is required to overlap these discontinuous regions 280.

After the crystallization process in the direction of 'X' axis is completed, the mask 270 or the stage is moved by a predetermined distance in the direction of 'Y' axis (in case of moving the stage, it is moved in the direction of '−Y' axis). And then, as illustrated in FIG. 8C, the laser irradiation process is performed again in the direction of 'X' axis, starting from the point where the first crystallization process is finished.

When the above-described crystallization process is repeatedly performed, a problem arises in that the polycrystalline silicon thin film has a plurality of first regions P1 having normal grains and a plurality of second regions P2 having the discontinuous regions, which have different crystallization characteristics and are located between the first regions P1. That is, when an LCD device is fabricated by incorporating such a silicon thin film having these discontinuous regions, the LCD device suffers from uneven characteristics, and thus, the quality of the LCD device becomes degraded. In addition, because the silicon thin film around the discontinuous regions remains in an amorphous silicon state, rather than having been crystallized, the next shot of the laser beam is required to overlap these discontinuous regions 280. These overlap regions (namely, X-overlap regions) in which the discontinuous regions overlap each other produce a shot mark. The shot mark decreases picture quality and produces non-uniform device characteristics, when it is applied to an LCD device or an organic light emitting diode.

Meanwhile, although not explained in the above crystallization process, the grains can be grown in the direction of 'Y' axis and the mask overlaps in the direction of 'Y' axis in order to increase the size of the grains, and then, the crystallization can be repeatedly performed. In this case, however, a shot mark may be produced in the overlap regions (namely, Y-overlap regions) in the direction of 'Y' axis.

The above problem of non-uniformity in crystallization characteristics becomes an important issue in a single scan crystallization method as well as the above-described transition method. Especially, the non-uniformity in crystallization characteristics causes non-uniformity in device characteristics, which relates to a channel orientation (i.e., a direction in which a channel is formed) of a thin film transistor made of the crystallized silicon thin film, and degrades the picture quality of a liquid crystal display device.

Accordingly, in the present invention, a slit pattern of a predetermined shape is constructed on a laser mask in a manner to be divided into two blocks and a laser beam is twice irradiated ("two-shot crystallization method") onto a silicon film using the laser mask. By this crystallization method, the entire surface of the silicon thin film is crystallized without an X-overlap or a Y-overlap.

That is, a laser mask of the present invention has two blocks, each having a predetermined pattern, which may have a periodicity or regularity. The pattern in the second block has the reverse pattern of the first block. By irradiating a laser beam two times through such a laser mask, a silicon film is crystallized into a polycrystalline silicon thin film having radial grains and uniform crystallization characteristics according to the principles of the present invention. Thus, when a device such as a thin film transistor is fabricated using the uniformly crystallized silicon thin film, the device has uniform characteristics substantially free of the device non-uniformity caused by the channel orientation.

Hereinafter, a laser mask and a method of crystallization using the same in accordance with the embodiments of the present invention will be described with reference to the accompanying drawings.

Figure 9:
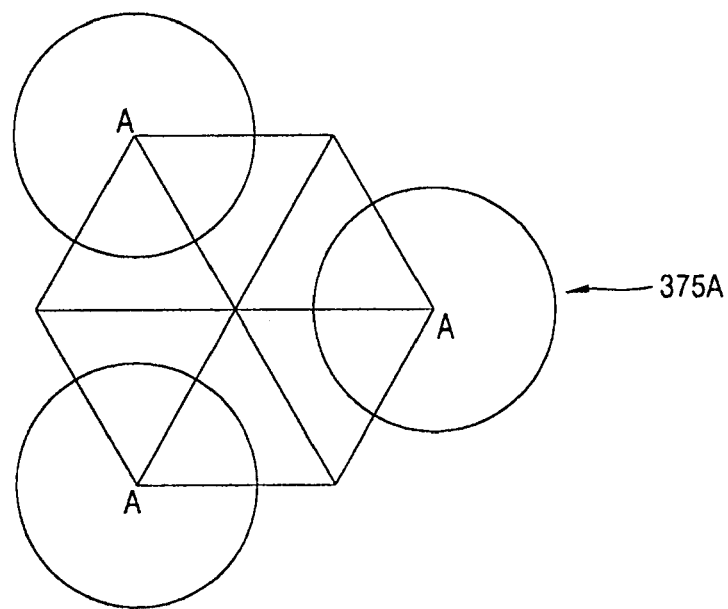
FIG. 9 is a schematic view illustrating a method for constructing a laser mask having a periodic pattern in accordance with a first embodiment of the present invention.

FIG. 9 is a schematic view illustrating a method for constructing a laser mask having a periodic pattern in accordance with a first embodiment of the present invention. The laser mask of this embodiment is constructed to have first and second blocks, with the first block having a periodic pattern and the second block having the reverse pattern of the first block.

Referring to FIG. 9, a laser mask is mainly divided into two blocks. Transmitting regions 375A (i.e., a round-shaped mask pattern) with position "A" are formed in a first block, and the remaining region excluding the transmitting regions 375A is formed as a transmitting region in a second block. As discussed above, one of the principles of the present invention is to provide a laser mask having two blocks, with one having a slit pattern and the other having the reverse pattern of the slit pattern. It should be appreciated that the above laser mask is merely one example, and that the present invention is not limited thereto.

The centers of the three adjacent transmitting regions 375A of position "A" are positioned at the three vertexes of a regular hexagon, as illustrated in FIG. 9. The size and distance between the transmitting regions 375A with position "A" should satisfy a certain relationship according to the first embodiment. This will be explained with reference to the accompanying drawings.

Figure 10:
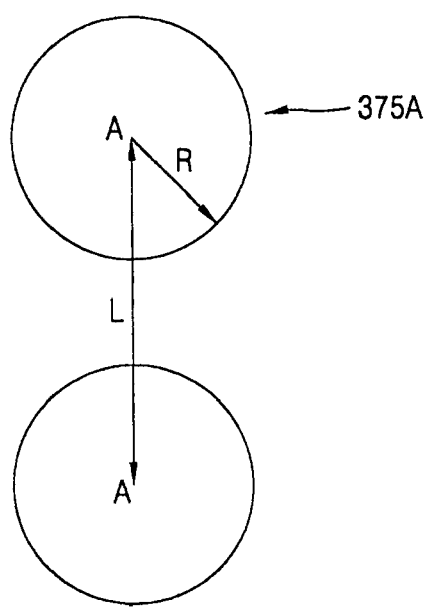
FIG. 10 is a schematic view illustrating the size and distance between the transmitting regions of FIG. 9.

FIG. 10 is a schematic view illustrating the size and distance between the transmitting regions of FIG. 9.

As shown, if the radius of the transmitting regions 375A of position A is R and the distance between the centers of the transmitting regions 375A is L, the radius R of the transmitting regions 375A should satisfy Equation 1 in order to crystallize the entirety of a predetermined region by irradiating a laser beam two times ("two-shot crystallization method").

$$R < L/2 \qquad \text{Equation 1}$$

That is, the transmitting regions 375A of position "A" have a radius R smaller than L/2, which is the condition under which adjacent transmitting regions 375A of position "A" contact each other.

In the laser mask, the remaining region excluding the transmitting regions 375A of position "A" is constructed as a transmitting region in the second block. Thus, the entirety of a predetermined region can be crystallized by two shots, when the radius R is smaller than L/2, which is the maximum value of the size of the transmitting regions 375A. Under this condition, adjacent mask patterns 375A of position "A" contact each other. A polycrystalline silicon film obtained by irradiating a laser beam two times using the laser mask has uniform characteristics. This will be explained in detail below.

Figure 11A:
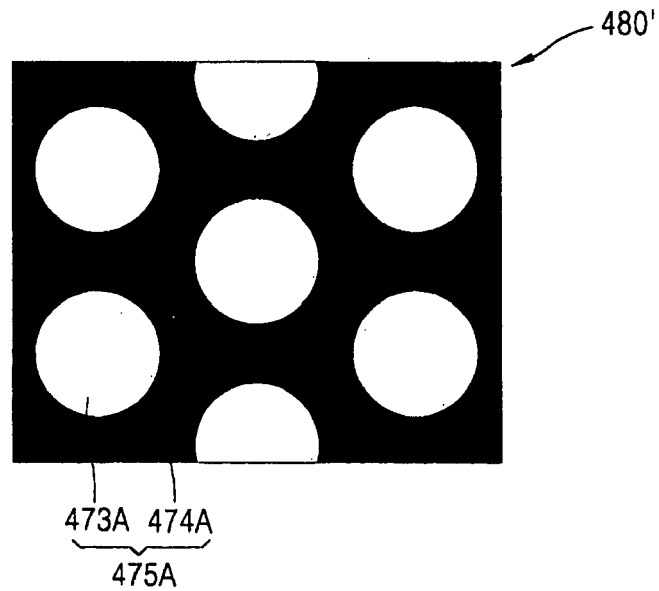
FIGS. 11A and 11B are schematic views illustrating parts of a two-block laser mask fabricated by the pattern constructing method described with reference to FIG. 9.
Figure 11B:
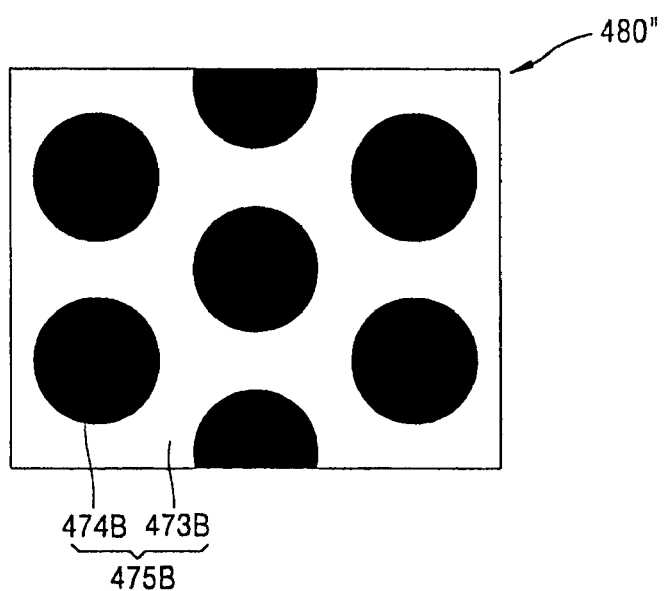

FIGS. 11A and 11B are schematic views illustrating parts of a two-block laser mask fabricated by the pattern constructing method described with reference to FIG. 9. In this example, mask pattern 475A (hereinafter, referred to as a reference pattern) having position "A" are formed in a first block 480' and mask pattern 475B (hereinafter, referred to as a reverse pattern), which has the reverse pattern of the first block, are formed in a second block 480". In this embodiment, the mask pattern 475A of position "A" is constructed as a reference pattern in the first block 480' by the patterning method described with reference to FIG. 9. As described above, the present invention is not limited thereto, and the shape and position of the mask pattern can vary.

As shown therein, the first block 480' includes a plurality of first transmitting regions 473A of a round shape for transmitting light and a first blocking region 474A for blocking light. The second block 480" includes a second transmitting region 473B for transmitting light corresponding to the first blocking region 474A (i.e., in a reversed shape) and a plurality of second blocking regions 474B for blocking light corresponding to the first transmitting regions 473A, both the second transmitting region 473B and second blocking regions 474B constructed to have the reverse pattern of the first block 480'. Although the first transmitting regions 473A and the second blocking regions 474B have a round-shape, the present invention is not limited thereto, and they can have a regular polygon shape such as a regular triangle, a regular square, a regular hexagon and a regular octagon. Further, although the first transmitting regions 473A and the second blocking regions 474B have the same size in FIGS. 11A and 11B, the present invention is not limited thereto, and they can have a variety of sizes and can be formed randomly according to the present invention.

Figure 12A:
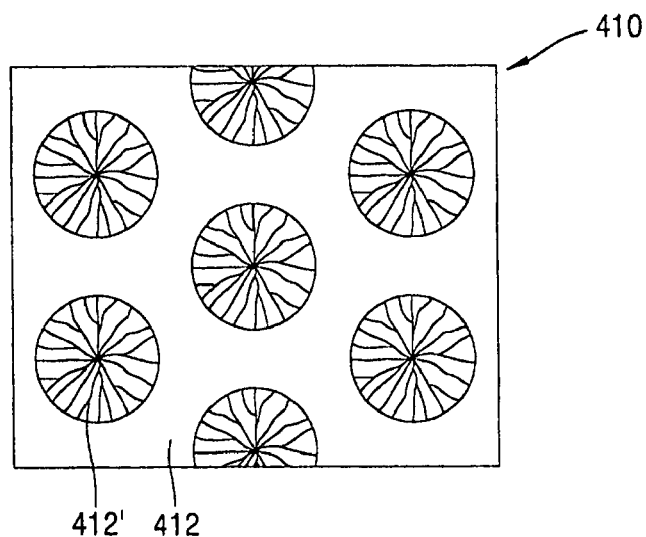
FIGS. 12A and 12B are schematic views illustrating a crystallization process for a silicon thin film using the laser mask illustrated in FIGS. 11A and 11B.
Figure 12B:
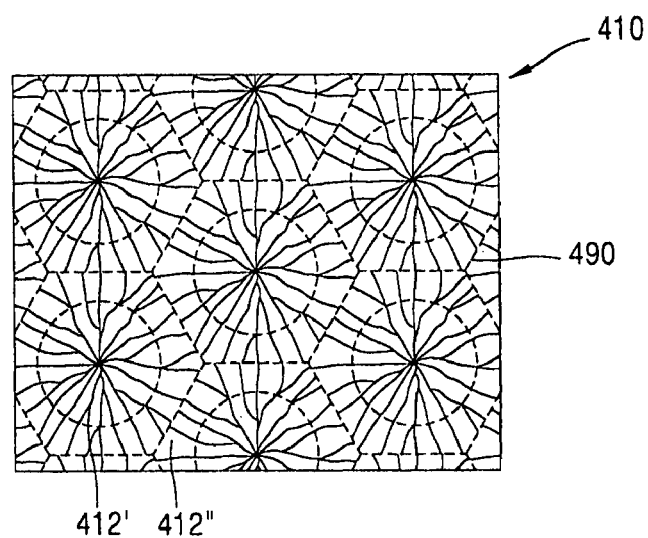

Meanwhile, FIGS. 12A and 12B are schematic views illustrating a crystallization process for a silicon thin film using the laser mask illustrated in FIGS. 11A and 11B. As illustrated, the entire surface of a silicon thin film is uniformly crystallized by irradiating a laser beam two times through the two-block laser mask illustrated above. This will be explained in more detail.

First, as shown in FIG. 12, when a first crystallization is performed by irradiating a laser beam onto a substrate 410 having a silicon thin film 412 through the first block 480' of FIG. 11A, that is, through the reference pattern 475A (i.e., through the first transmitting regions 473A of the mask pattern 475A), crystals grow toward the centers of the round-shaped reference pattern 475A using an amorphous silicon thin film 412 (solid phase) positioned at the circumferential interface as a nucleus, thereby forming polycrystalline silicon thin films 412', which are first crystals having a radial grain.

The regions crystallized by the first crystallization correspond to the first transmitting regions 473A of the mask.

When the number of the transmitting regions of the mask is seven, the crystallized regions also have seven round-shaped polycrystalline silicon thin films 412'.

When the first crystallization is finished, the second block 480" of FIG. 11B is applied to the substrate 410 where the first polycrystalline silicon thin films 412' are formed, and a laser beam is irradiated to perform a second crystallization. At this time, the second block 480" has the reverse pattern 475B. As a result of the second crystallization, as illustrated in FIG. 12B, crystals grow in an outside direction of the round-shaped crystallized silicon thin films, starting from the circumferences of the silicon thin films 412' crystallized by the first crystallization (i.e., using the circumferences of the silicon thin films 412' as the seeds of the crystalline growth), thereby forming polycrystalline silicon thin films 412" which are second crystals. In this embodiment, the entire surface of the substrate 410 is crystallized by irradiating a laser beam two times through the laser mask without an X-overlap or a Y-overlap, i.e., without a shot mark. In addition, since each block of the laser mask has a periodic pattern, regular hexagon-shaped grain boundaries 490 are formed and uniformly distributed in the resultant polycrystalline thin film. Thus, the resultant polycrystalline thin film has uniform crystallization characteristics.

Figure 13:
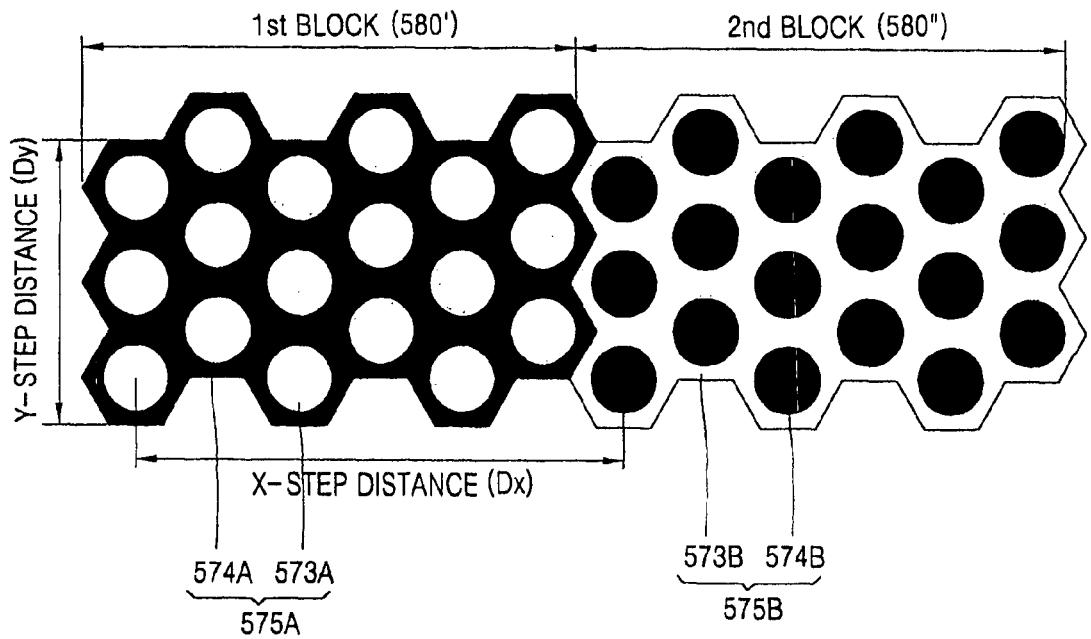
FIG. 13 is a schematic view illustrating a method for constructing a laser mask in accordance with the first embodiment of the present invention.

A method for constructing a laser mask according to the first embodiment will now be described. FIG. 13 is a schematic view illustrating a method for constructing a laser mask in accordance with the first embodiment of the present invention.

Referring to FIG. 13, a reference pattern 575A is positioned in a first block 580' and a reverse pattern 575B of the reference pattern 575A is positioned in a second block 580". The mask patterns 575A and 575B are formed in the first and second blocks 580' and 580" according to the pattern constructing method of the first embodiment illustrated in FIG. 9. A plurality of round-shaped first transmitting regions 573A are positioned in a regular hexagon shape in the first block 580', and a plurality of second blocking regions 574B, which are the reverse pattern of the first transmitting regions 573A, are positioned in the same regular hexagon shape as the first transmitting region 573A in the second block 580". However, this is only an example, and a laser mask according to the present invention is not restricted to such a periodicity or regularity. For example, the reverse pattern 575B may be positioned in the first block 580' and the reference pattern 575A may be positioned in the second block 580".

Meanwhile, the blocks 580' and 580" can be used as a reference for the next shot during the crystallization. Herein, X-step distance (Dx) represents the moving distance of a mask or stage in an X-axis direction for performing X-axis crystallization, and Y-step distance (Dy) represents the moving distance of a mask or stage in a Y-axis direction for performing Y-axis crystallization after the completion of the X-axis crystallization. Further, the X-step distance (Dx) for X-stepping and the Y-step distance (Dy) for Y-stepping are determined in consideration of the periodic patterns of the blocks 580' and 580" in order to eliminate an X-overlap or a Y-overlap.

Figure 14:
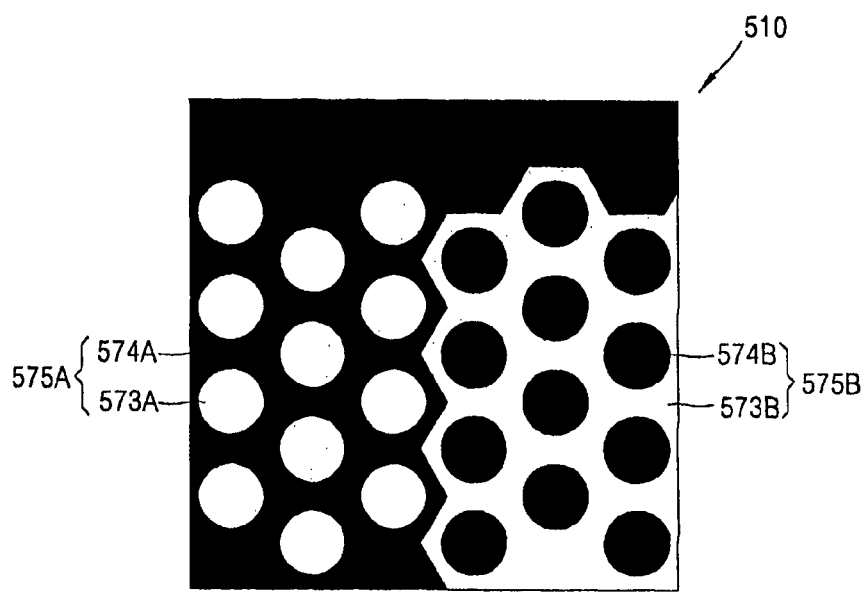
FIG. 14 is a schematic view illustrating a laser mask fabricated by the laser mask construction method described in FIG. 13.

A laser mask having the above-mentioned characteristics will be exemplified. FIG. 14 is a schematic view illustrating a laser mask fabricated by the laser mask construction method described in FIG. 13.

As shown therein, a laser mask 570 has a reference pattern 575A including a first transmitting regions 573A and a first blocking region 574A and a reverse pattern 575B including a second transmitting region 573B and second blocking regions 574B. The laser mask 570 blocks laser beam incident on the blocking regions 574A and 574B excluding the transmitting regions 573A and 573B of the mask patterns 575A and 575B. The laser mask 570 can be made of metal that is excellent in reflecting laser beam, such as aluminum.

Meanwhile, the laser mask 570 has a pattern different from the pattern described above (particularly in the boundary regions of the blocks shown in FIG. 13). This is because the laser mask 570 is fabricated in consideration of the shape of the second transmitting region 573B of the reverse pattern 575B in the second block 580". That is, the second transmitting region 573B of the reverse pattern 575B is unable to form a boundary in the mask. Thus, a predetermined blocking region is formed in the boundary region of the second block 580", as illustrated in FIG. 14.

Hereinafter, a crystallization process for a silicon thin film using the laser mask of FIG. 14 will be described. The crystallization process is performed in the order as explained in FIGS. 12A and 12B, and X-axis and Y-axis crystallizations based on the above order will be explained.

First, a first crystallization is performed by irradiating a laser beam onto a substrate having amorphous silicon deposited through the above-described laser mask illustrated in FIG. 13 or FIG. 14. The laser beam has an energy density of the complete melting region, which is described in an earlier section. After the irradiation, crystals grow from the amorphous silicon thin film (solid phase) positioned at the circumferential interface. As a result, polycrystalline silicon thin films, which are first crystals having a radial grain, are formed.

When the first crystallization is finished, the mask or stage where the substrate is placed is moved in the X-axis direction by a X-step distance (Dx). Then a laser beam is irradiated, and a second crystallization proceeds using the silicon thin films crystallized by the first crystallization as the seeds of the crystal growth. By this, as described above, uniform polycrystalline silicon thin films having a regular hexagon-shaped grain boundary are formed surrounding the first crystallized silicon thin film.

Once the X-axis crystallization is completed by repeatedly moving the mask or substrate in the X-axis direction and irradiating a laser beam through the laser mask, the Y-axis crystallization starts. During the Y-axis crystallization, the mask or stage is moved to a predetermined distance in the Y-axis direction (in case of moving the stage, in the minus Y-axis direction), and then the X-axis crystallization is again performed in the direction of minus X-axis, starting from the part where the X-axis crystallization is finished. By repeatedly performing the X-axis and Y-axis crystallizations, a desired size of polycrystalline silicon film having uniform crystallization characteristics can be obtained.

Figure 15:
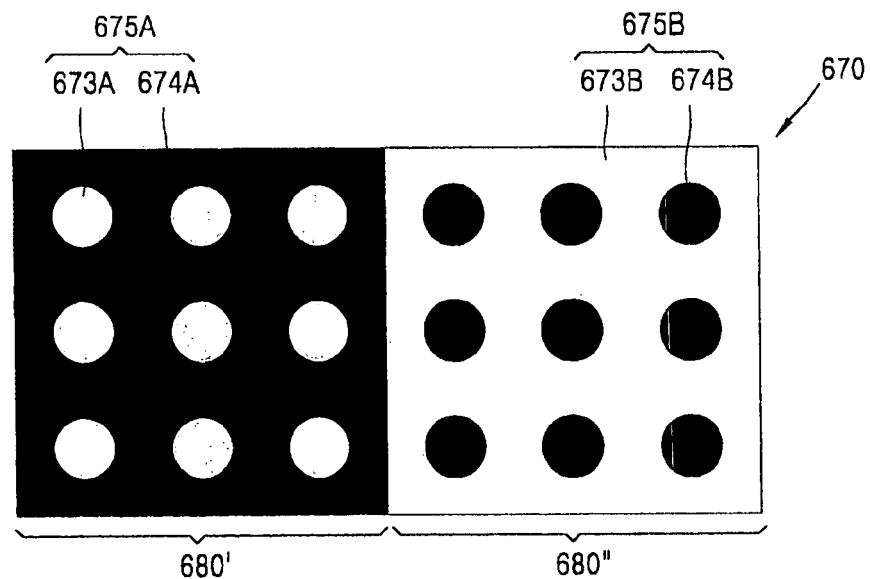
FIG. 15 is a schematic view illustrating a laser mask in accordance with a second embodiment of the present invention.

In this embodiment, the reference pattern has a regular hexagon shape shown in FIG. 9 or 13. However, the present invention is not limited thereto, and a laser mask according to the present invention can be constructed with a reference pattern having a regular square shape shown in FIG. 15. FIG. 15 is a schematic view illustrating a laser mask in accordance with a second embodiment of the present invention.

As shown therein, a laser mask 670 includes a reference pattern 675A having a regular square shape in a first block 680' and a reverse pattern 675B in a second block 680". The reference pattern 675A has a plurality of first transmitting regions 673A and a first blocking region 674A. The reference pattern has a regular square shape in that the centers of the four adjacent transmitting regions form a regular square. The reverse pattern 675B has the reverse shape of the reference pattern 675A, i.e., having round-shaped second blocking regions 674B, which are the reverse shape of the first transmitting regions 673A, and a second transmitting region 673B, which is the reverse shape of the first blocking region 674A. Although the first transmittance regions 673A and the second blocking regions 674B have round-shaped patterns, the present invention is not limited thereto, and they can be constructed to have a regular polygon shape, such as a regular triangle, a regular square, a regular hexagon and a regular octagon. Further, the round-shaped first transmittance regions 673A and second blocking regions 674B are not required to have the same size.

Figure 16:
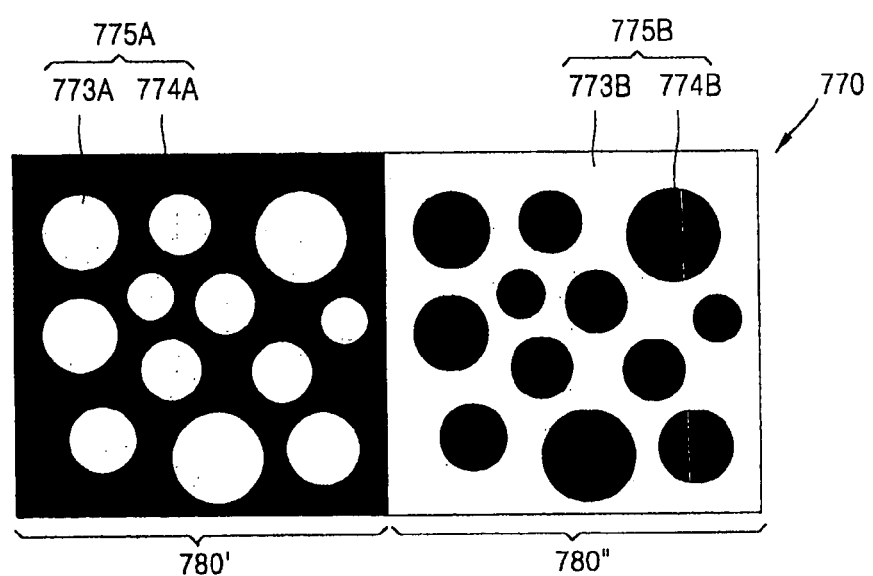
FIG. 16 is a schematic view illustrating a laser mask in accordance with a third embodiment of the present invention.

The laser masks in the embodiments described above includes a pattern, which has a periodicity or regularity. However, the present invention is not limited thereto, and is applicable to a two-block laser mask having an irregular or random pattern. FIG. 16 is a schematic view illustrating a laser mask having an irregular or random pattern in accordance with a third embodiment of the present invention.

As shown therein, a laser mask 770 includes a reference pattern 775A having a plurality of round-shaped first transmitting regions 773A and a first blocking region 774A in a first block 780' and a reverse pattern 775B having a plurality of second blocking regions 774B, which are the reverse shape of the first transmitting regions 773A, and a second transmitting region 773B, which is the reverse shape of the first blocking region 774A, in a second block 780". The first transmitting regions 773A and the second blocking regions 774B do not have the same size and are positioned randomly without any regularity, which is different from the second embodiment, as illustrated in FIG. 16. As in the first and second embodiments, a uniform polycrystalline silicon thin film can be obtained by irradiating a laser beam two times through the laser mask having an irregular or random pattern.

That is, the two-shot crystallization method of the present invention is applicable regardless of the shape and position of a pattern constructed on a two-block laser mask, as long as the second block has the reverse pattern of the first block. Accordingly, the entire surface of a silicon thin film can be crystallized by two shots.

Figure 17:
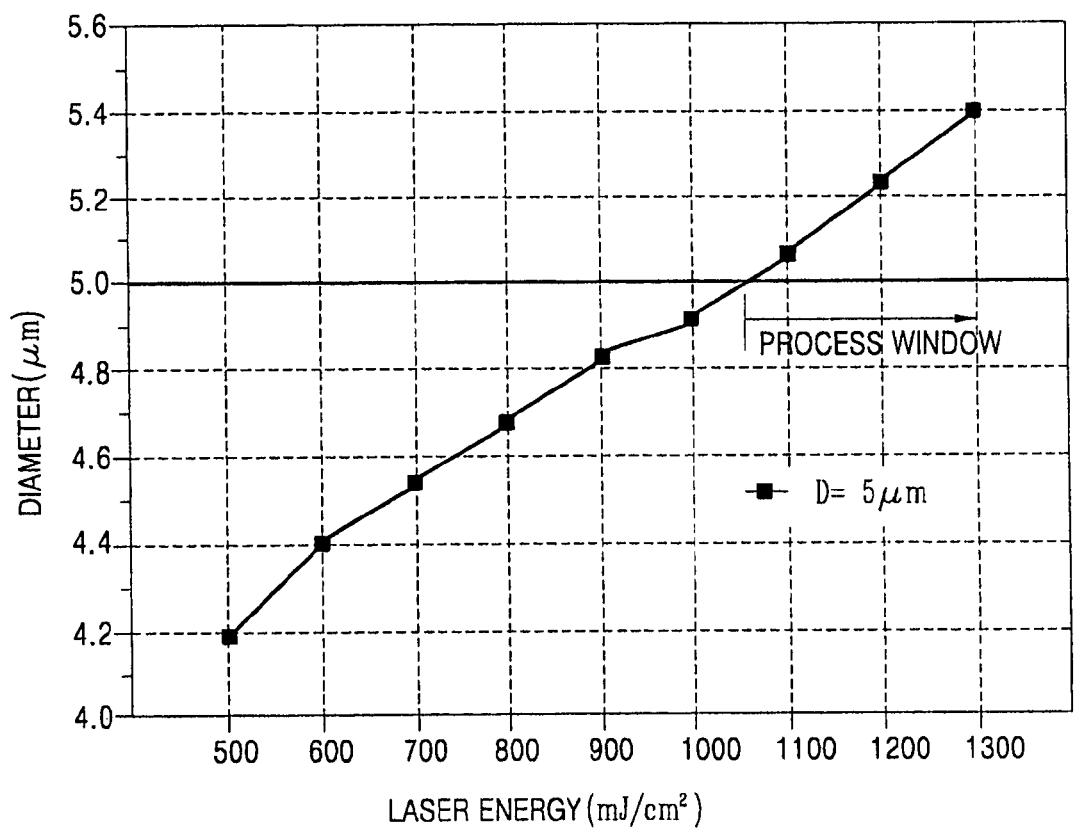
FIG. 17 is a graph showing laser crystallization energy region for a laser crystallization method according to the present invention.

Meanwhile, FIG. 17 is a graph showing laser crystallization energy region for a laser crystallization method according to the present invention. For example, a laser crystallization energy region for a laser mask having a dot pattern, in which the diameter of each dot pattern is 5 μm, is shown. A laser mask of the first embodiment, which has a regular hexagonal pattern, is used to obtain the graph in FIG. 17. It is also possible to obtain the substantially same result with a laser mask of the second or third embodiment.

As shown therein, when the diameter of a dot pattern in a laser mask is 5 μm, the size of a crystallized pattern in a thin film can be greater than 5 μm if the laser used has a laser energy density more than 1100 mJ/cm$^2$. Further, the graph shows, if laser energy density is about 1300 mJ/cm$^2$, the size of a crystallized pattern is increased to 5.4 μm. That is, the entire surface of a silicon thin film on a substrate can be crystallized by the two-shot crystallization of present invention, even if there is an alignment error of 0.8 μm or less, which is twice 0.4 μm. The alignment error occurs when moving either a mask or a substrate for the crystallization.

For example, when a laser having an energy density of about 1300 mJ/cm$^2$ is used for the two-shot crystallization method, the entire surface can be crystallized even with an alignment error of 0.8 μm or less, because the size of the crystallized pattern is greater than the reference pattern in the laser mask by 0.4 μm.

Figure 18:
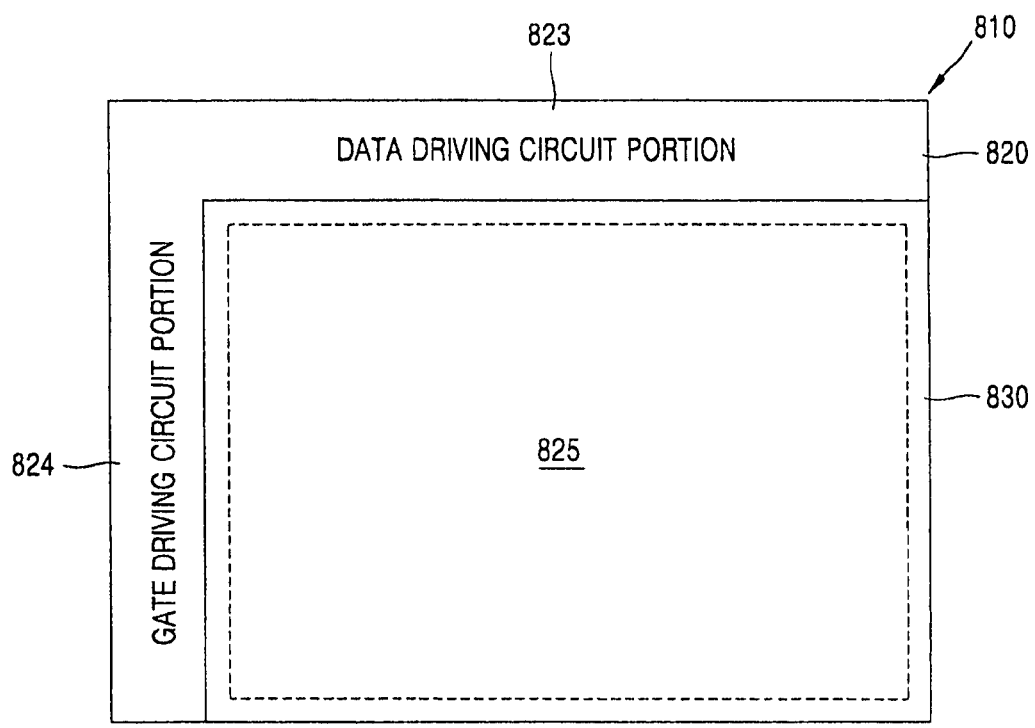
FIG. 18 is a plan view illustrating a structure of a liquid crystal display panel, in which a driving circuit is integrated with the array substrate of the liquid crystal display panel.

A method for fabricating a liquid crystal display device using the silicon thin film having the improved crystallization characteristics in accordance with the present invention will now be described. FIG. 18 is a plan view illustrating a structure of a liquid crystal display panel, in which a driving circuit is integrated with the array substrate of the LCD panel.

As shown therein, the driving circuit-integrated LCD panel includes an array substrate 820, a color filter substrate 830, and a liquid crystal layer (not shown) formed between the array substrate 820 and the color filter substrate 830. The array substrate 820 includes a pixel unit 825, an image display region where unit pixels are arranged in a matrix configuration, and a gate driving circuit unit 824 and a data driving circuit unit 823 positioned at an outer edge of the pixel unit 825. Though not shown, the pixel unit 825 of the array substrate 820 includes a plurality of gate lines and data lines arranged vertically and horizontally and defining a plurality of pixel regions on the substrate 820. The pixel unit further includes a thin film transistor, a switching device formed near the crossings of the gate lines and the data lines, and pixel electrodes formed at the pixel regions. As a switching device for applying a signal voltage to the pixel electrode, the thin film transistor (TFT) is a field effect transistor (FET) for controlling a flow of current by an electric field.

Regarding the driving circuit part 823 and 824 of the array substrate 820, the data driving circuit unit 823 is positioned at the longer side of the array substrate 820 which is protruded compared with the color filter substrate 830, and the gate driving circuit unit 824 is positioned at the shorter side of the array substrate 820. In order to suitably output an inputted signal, the gate driving circuit unit 824 and the data driving circuit unit 823 use a thin film transistor with a CMOS (Complementary Metal Oxide Semiconductor) structure, an inverter. For reference, the CMOS is an integrated circuit with a MOS structure used for high signal processing, and needs P channel and N channel transistors. Its speed and density characteristics are in between the NMOS and the PMOS. The gate driving circuit unit 824 and the data driving circuit unit 823, which are devices for supplying a scan signal and a data signal to the pixel electrode through the gate line and the data line, are connected to an external signal input terminal (not shown) so as to control an external signal transmitted through the external signal input terminal and output it to the pixel electrode.

Although not shown, a color filter for implementing color and a common electrode, which is a counter electrode of the pixel electrode formed on the array substrate 820, are formed on the image display region 825. A spacer between the array substrate and the color filer substrate is formed to provide a uniform cell gap. The array substrate and the color filter substrate are attached by a seal pattern formed at an outer edge of the image display region, to form a unit liquid crystal display panel. The two substrates are attached through an attachment key formed at the array substrate or the color filter substrate. The driving circuit-integrated LCD panel using the polycrystalline silicon thin film has many advantages in that it has excellent device characteristics, excellent picture quality, adequate display capability and low power consumption.

Figure 19:
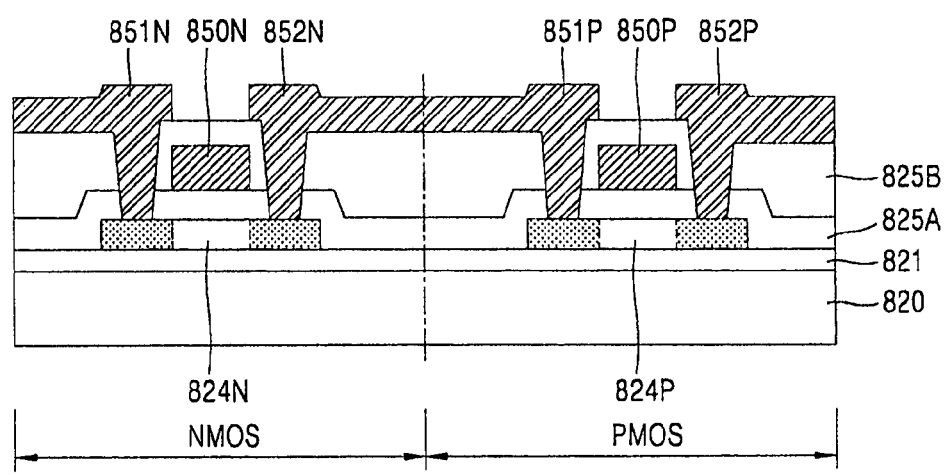
FIG. 19 illustrates an example of a CMOS liquid crystal display device fabricated using a silicon thin film crystallized by a crystallization method in accordance with the present invention.

Hereinafter, a CMOS liquid crystal display device using a crystallized silicon thin film fabricated in accordance with the present invention will be described in detail. FIG. 19 illustrates an example of a CMOS liquid crystal display device fabricated using a silicon thin film crystallized by a crystallization method in accordance with the present invention. As for the thin film transistor (TFT) formed at the pixel unit, both N-type and P-type TFT are available. For the driving circuit unit, either the N-type TFT or the P-type TFT can be used as in the pixel unit, or the CMOS structure having both the N-type TFT and the P-type TFT can be also used.

Hereinafter, a method for fabricating a CMOS liquid crystal display device will be described. First, a buffer layer 821 made of a silicon oxide film SiO$_2$ is formed on a substrate 820 made of an insulating material such as glass. Next, active layers 824N and 824P made of polycrystalline silicon are formed on the buffer layer 821. The active layers 824N and 824P are formed with a polycrystalline silicon thin film having uniform crystallization characteristics without a shot mark by depositing an amorphous silicon thin film on the substrate 820 and then laterally crystallizing the same by two shots using a two-block laser mask of the present invention. Afterwards, the polycrystalline silicon thin film crystallized is patterned through a photolithography process to form the active layer patterns 824N and 824P on NMOS and PMOS regions.

Afterwards, a gate insulating film 825A is deposited on the substrate 820 where the active layers 824N and 824P are formed.

Next, gate electrodes 850N and 850P made of molybdenum (Mo), aluminum (Al) or an aluminum alloy are formed on predetermined regions (i.e., channel regions of the active layers 824N and 824P) of the substrate 820 having the gate insulating film 825A deposited thereto. The gate electrodes 825N and 825P are formed by depositing a gate metal on the entire surface of the substrate 820 having the gate insulating film 825A formed thereto and then patterning the gate metal to form the gate electrodes 825N and 825P using a photolithography process.

Next, a N-type thin film transistor (i.e., a thin film transistor having source/drain regions doped with N+ ions) and a P-type thin film transistor are formed by performing a N-doping process and a P-doping process. At this time, the source and drain regions of the N-type thin film transistor are formed by implanting an element of fifth group such as phosphorous (P) capable of donating electrons. Further, the source and drain regions of the P-type thin film transistor are formed by implanting an element of third group such as boron (B) capable of donating holes.

Next, an interlayer insulating film 825B is deposited on the entire surface of the substrate 820, and then contact holes exposing parts of the source/drain regions are formed using a photolithography process.

Finally, source and drain electrodes 851N, 851P, 852N and 852P electrically connected to the source and drain regions through the contact holes are formed are formed, thereby completing a CMOS liquid crystal display device shown in FIG. 19.

Meanwhile, although this embodiment describes a method for fabricating a liquid crystal display device using a silicon thin film crystallized in accordance with the present invention, the present invention is not limited thereto, but applicable to other devices such as an organic EL or the like.

As described above, according to the present invention, a two-block laser mask is formed in which the first block has a predetermined pattern in a first block and the second block has the reverse pattern of the pattern in the first block. Then, a silicon film is crystallized into a polycrystalline silicon thin film having uniform crystallization characteristics by irradiating a laser beam two times through the two-block laser mask. The resultant polycrystalline silicon thin film is substantially free of a shot mark, that is, an X-overlap or a Y-overlap. In addition, when a flat panel display device is fabricated using such a polycrystalline silicon thin film, uniform device characteristics can be obtained and thus the quality of the flat panel display device can be improved. Moreover, the present invention can improve the yield and reduce the manufacturing cost because of the two-shot crystallization method.

It will be apparent to those skilled in the art that various modifications and variations can be made in the above-discussed display device and the driving method thereof without departing from the spirit or scope of the invention. Thus, it is intended that the present invention cover the modifications and variations of this invention provided they come within the scope of the appended claims and their equivalents.

What is claimed is:

1. A method for fabricating a flat panel display device having a thin film transistor as a switching device comprising:
   providing a substrate having a silicon thin film; and
   crystallizing the silicon film into a polycrystalline silicon thin film to form an active layer of the thin film transistor using a laser mask, the laser mask has a reference pattern in a first block and the reverse pattern of the reference pattern in a second block.

2. The method of claim 1, wherein crystallizing the silicon film into a polycrystalline silicon thin film further includes:
   positioning the first block of the laser mask over a portion of the silicon film and irradiating a first laser beam through the first block; and moving either the laser mask or the substrate to position the second block of the laser mask over the portion of the silicon film and irradiating a second laser beam through the second block.

3. The method of claim 1, wherein the flat panel device is a liquid crystal display device or an electroluminescence diode.

4. A flat panel display device having a thin film transistor as a switching device comprising:
   an active layer of the thin film transistor including a polycrystalline silicon thin film,
   wherein the polycrystalline silicon thin film includes a polygon shape grain boundary,
   wherein the polycrystalline silicon thin film includes first crystals crystallized by a first crystallization and second crystals crystallized by a second crystallization and
   wherein the first crystals have a radial grains growing toward centers of the first crystals and the second crystals grow in an outside direction of the first crystals, starting from circumferences of the first crystals.

5. The device of claim 4, wherein the polygon shape includes a regular triangle, a regular square, a regular hexagon and a regular octagon.

6. The device of claim 4, wherein the flat panel device is a liquid crystal display device or an electroluminescence diode.

7. The device of claim 4, wherein the first crystals crystallized by the first crystallization correspond to a reference pattern in a first block of a mask and the second crystals crystallized by the second crystallization correspond to a reverse pattern of the reference pattern in a second block of the mask.

* * * * *